(12) United States Patent
Loncaric

(10) Patent No.: US 11,781,886 B2
(45) Date of Patent: Oct. 10, 2023

(54) VOLTAGE SAMPLING USING AN ENERGY PULSE, AND RELATED SYSTEMS, METHODS AND DEVICES

(71) Applicant: Microchip Technology Incorporated, Chandler, AZ (US)

(72) Inventor: Mirko Loncaric, Wuppertal (DE)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 17/446,768

(22) Filed: Sep. 2, 2021

(65) Prior Publication Data

US 2022/0065665 A1 Mar. 3, 2022

Related U.S. Application Data

(60) Provisional application No. 62/706,704, filed on Sep. 3, 2020.

(51) Int. Cl.
| | |
|---|---|
| *G01D 5/24* | (2006.01) |
| *H02J 7/00* | (2006.01) |
| *H02J 7/34* | (2006.01) |
| *G01R 27/26* | (2006.01) |
| *G01R 19/165* | (2006.01) |

(52) U.S. Cl.
CPC ......... *G01D 5/24* (2013.01); *G01R 19/16585* (2013.01); *G01R 27/2605* (2013.01); *H02J 7/0068* (2013.01); *H02J 7/345* (2013.01)

(58) Field of Classification Search
CPC ........ G01R 27/00; G01R 27/02; G01R 27/26; G01R 27/2605; G01R 19/00; G01R 19/165; G01R 19/16566; G01R 19/16585; G01D 5/00; G01D 5/12; G01D 5/14; G01D 5/24; H02J 7/00; H02J 7/0068; H02J 7/34; H02J 7/345
USPC ................................ 324/600, 649, 658, 686
See application file for complete search history.

(56) References Cited

U.S. PATENT DOCUMENTS

| | | | |
|---|---|---|---|
| 5,730,165 A | 3/1998 | Philipp | |
| 8,059,103 B2 * | 11/2011 | Geaghan | G06F 3/041661 345/173 |
| 10,949,032 B2 * | 3/2021 | Jiang | G06F 3/0446 |
| 2010/0181180 A1 | 7/2010 | Peter | |

FOREIGN PATENT DOCUMENTS

DE 19855896 A1 12/1999

OTHER PUBLICATIONS

Layton, "Capacitive Voltage Divider (CVD) Operation on 8-Bit PIC(r) Microcontrollers", Microchip CVD Overview TB3198, 2018, 12 pages.

(Continued)

*Primary Examiner* — Hoai-An D. Nguyen
(74) *Attorney, Agent, or Firm* — TraskBritt

(57) ABSTRACT

A disclosed method includes: setting a connector of an acquisition circuit and an associated capacitor to a predetermined potential; providing an energy pulse of a predetermined first time duration to the connector; at a time occurring substantially at a predetermined second time duration after an end of the predetermined first time duration of the energy pulse, coupling the associated capacitor and the connector of the acquisition circuit; and sampling a voltage being exhibited across the associated capacitor.

24 Claims, 7 Drawing Sheets

(56) References Cited

OTHER PUBLICATIONS

International Search Report from International Application No. PCT/US2021/071345, dated Feb. 23, 2022, 4 pages.
International Written Opinion from International Application No. PCT/US2021/071345, dated Feb. 23, 2022, 5 pages.

* cited by examiner

US 11,781,886 B2

VOLTAGE SAMPLING USING AN ENERGY PULSE, AND RELATED SYSTEMS, METHODS AND DEVICES

CROSS-REFERENCE TO RELATED APPLICATION

This application claims the benefit under 35 U.S.C. § 119(e) of U.S. Provisional Patent Application Ser. No. 62/706,704, filed Sep. 3, 2020, the disclosure of which is hereby incorporated herein in its entirety by this reference.

FIELD

One or more examples relate, generally, to capacitive sensors and measuring self-capacitance of an electrode. One or more examples relate, generally, to touch sensors. One or more examples relate, generally, to material level sensors.

BACKGROUND

Capacitive sensors are used in a variety of operational contexts, including without limitation, as material level sensors and touch sensors.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
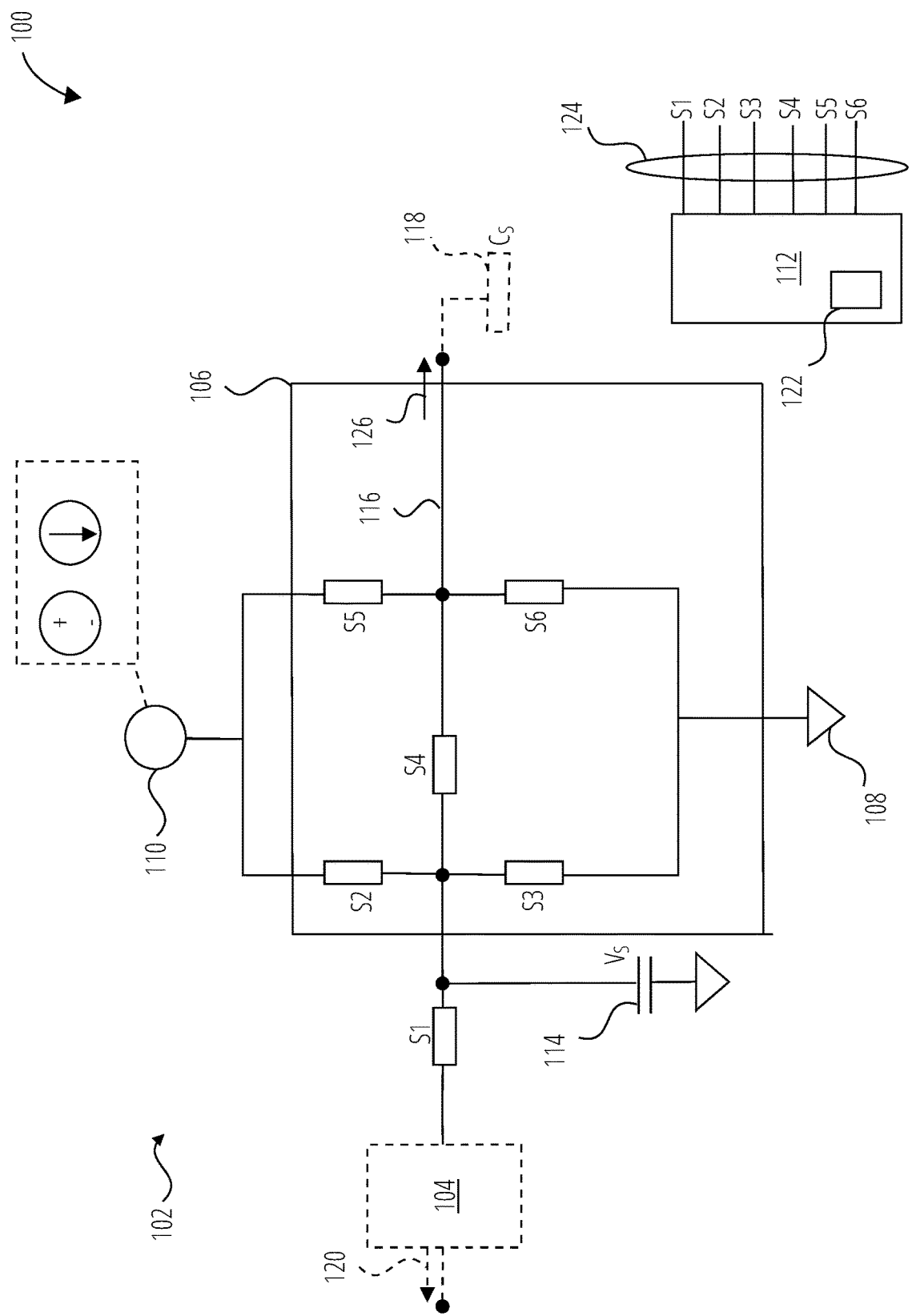
FIG. 1 is a schematic diagram of an apparatus that includes an acquisition circuit in accordance with one or more examples.

In the following detailed description, reference is made to the accompanying drawings, which form a part hereof, and in which are shown, by way of illustration, specific examples in which the present disclosure may be practiced. These examples are described in sufficient detail to enable a person of ordinary skill in the art to practice the present disclosure. However, other examples enabled herein may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example, nor this disclosure, to the specified components, steps, features, functions, or the like.

It will be readily understood that the components of the examples as generally described herein and illustrated in the drawings could be arranged and designed in a wide variety of different configurations. Thus, the following description of various examples is not intended to limit the scope of the present disclosure, but is merely representative of various examples. While the various aspects of the examples may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are examples only and should not be construed as the only way to implement the present disclosure unless specified otherwise herein.

Additionally, block definitions and partitioning of logic between various blocks is an example of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the examples disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein—all of which are encompassed by use of the term "processor." A general-purpose processor may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code, without limitation) related to examples of the present disclosure.

Examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" or "about" in reference to a given parameter, property, or condition means and includes to a degree that one of ordinary skill in the art would understand that the given parameter, property, or condition is met with a small degree of variance, such as within acceptable manufacturing or operating tolerances. By way of example, depending on the particular parameter, property, or condition that is substantially met, the parameter, property, or condition may be at least 90% met, at least 95% met, or even at least 99% met.

As used herein, any relational term, such as "over," "above," "under," "on," "underlying," "upper," or "lower," without limitation, is used for clarity and convenience in understanding the disclosure and accompanying drawings and does not connote or depend on any specific preference, orientation, or order, except where the context clearly indicates otherwise.

In this description the term "coupled" and derivatives thereof may be used to indicate that two elements co-operate or interact with each other. When an element is described as being "coupled" to another element, then the elements may be in direct physical or electrical contact or there may be intervening elements or layers present. In contrast, when an element is described as being "directly coupled" to another element, then there are no intervening elements or layers present.

The term "connected" may be used in this description interchangeably with the term "coupled," and has the same meaning as "coupled" unless expressly indicated otherwise or the context would indicate otherwise to a person having ordinary skill in the art. It will be understood that when an element is referred to as "connecting" or "coupling" a first element and a second element then it is coupled to the first element and it is coupled to the second element.

When an element is referred to herein as being "electrically coupled" to another element, then one or more of charge or signals can be transferred between the element and the other element, directly or via intervening elements if any are present. It will be understood that when an element is referred to as "electrically connecting" or "electrically coupling" a first element and a second element, then one or more of charge or signals can be transferred between the first element and the second element via the element, directly or via intervening elements if any are present.

In various examples described herein, a capacitive sensor may respond (e.g., reliably exhibit a detectable change in capacitance, without limitation) to an object's (such as a finger, stylus, material or other reliably detectable object, without limitation) contact with, or proximity to, a capacitive sensor. In this disclosure, "contact" or "touch" is meant to encompass physical contact with a capacitive sensor and encompass presence within a proximity of the capacitive sensor such that that capacitive sensor may be expected to reliably respond to such presence even without physical contact. Actual physical contact with a capacitive sensor is not required.

A capacitive sensor may respond to a change in capacitance of an object touching a capacitive sensor (e.g., in the case of a level sensor for detecting the level of a material in a tank, without limitation), such as may be caused by a change in a quantity or quality of a material or materials of the object, without limitation.

Self-capacitance is a capacitance of an electrode to a virtual ground, and such virtual ground may or may not be known. A self-capacitance sensor is a capacitive sensor that individually (or in a case of a sensor array, collectively) responds to changes in self-capacitance. When the self-capacitance of an electrode is measured, it is typically with respect to a signal that has a local ground as a reference potential, and the signal serves as an indication of the self-capacitance of the electrode and an external capacitive network coupled to it.

A typical process for generating a voltage signal that is indicative of self-capacitance of an electrode involves acquiring a voltage on a capacitor associated with an acquisition circuit, which associated capacitor is typically of a predetermined capacitance and coupled to ground (a capacitive voltage divider), that is indicative of self-capacitance and then sampling the voltage to generate a numerical value representative of self-capacitance. The associated capacitor and an external capacitive network (via the electrode) are first charged (pre-charged) to different known voltage levels. Once charged, the capacitor and external capacitive network (via the electrode) are coupled, and their respective voltage levels distribute equally. Once the voltage levels are settled, a sampling circuit (e.g., an analog-to-digital-converter (ADC), without limitation), of the acquisition circuit, samples the voltage level of the voltage across the capacitor and generates a value that is indicative of the self-capacitance of the electrode and an external capacitive network coupled thereto.

From a design perspective, it is generally desirable that changes in a physical measurement environment of a capacitive sensor should not influence change in a measurement result. As a non-limiting example, a high impedance conductive material, and its associated capacitance, on a sensor array will influence measurement results unpredictably. As a non-limiting example, deposit materials of a measured medium may build up on a surface of a capacitive sensor or sensor array. As a non-limiting example, over time, built deposit material may form one or more layers of high impedance conductive material (a "deposit layer") on a surface of one or more sensors, e.g., touch sensors, proximity sensors or level sensors. As a further non-limiting example, a high impedance conductive material, such as paint, may be purposefully applied to a protective layer or a coating, to form a high impedance conductive layer. As a further non-limiting example, a high impedance conductive puddle may at least temporarily form on a protective layer overlaying a capacitive sensor or capacitive sensor array. For ease of discussion any high impedance conductive material regardless of how it is formed is referred to herein as a "deposit material."

Such high impedance conductive materials may form at least a portion of an unintended capacitor together with an intended capacitor of the external capacitive network, and the unintended capacitor may influence the pre-charging voltage level applied to the electrode and external capacitive network coupled thereto, and the result of the voltage levels distributing equally. For example, charge may transfer from a lower impedance, intended capacitor to the higher impedance, unintended capacitor and affect the voltage level seen at the electrode and shared with the associated capacitor of the acquisition circuit. Such high impedance conductive materials may in other examples be a cause of crosstalk between different sensors.

The inventor of this disclosure appreciate that a voltage acquisition process that does not depend on the external capacitive network reaching a steady state of an applied voltage would be desirable, as a non-limiting example, to provide some immunity against the unpredictable influence of high impedance conductive materials on self-capacitive measurements.

One or more examples relate, generally, to a process for acquiring a voltage that is indicative of self-capacitance of an electrode, and more specifically, of an intended capacitor of a capacitive network coupled thereto. An associated capacitor, i.e., the capacitor associated with the acquisition circuit, and an electrode are charged to a predetermined potential and an energy pulse (e.g., a current pulse or a voltage pulse, without limitation) of a predetermined time duration is applied to the fully discharged electrode.

In one or more examples, a time duration of the energy pulse is chosen (predetermined) to only partially charge an unintended capacitor of a high impedance conductive material, if it charges an unintended capacitor at all, that may, or may not, be present at the external capacitive network. If a high impedance conductive material is present, the time duration of the energy pulse may be predetermined to store the energy of the energy pulse primarily in the low impedance, intended capacitor. If a high impedance conductive material is not present, the energy of the voltage pulse is stored in the intended capacitor. The disclosed process then couples the associated capacitor and the electrode and thus, the associated capacitor and the external capacitive network are coupled before an unintended capacitor, if any is present, can influence the signal more than negligibly. The signal received at the associated capacitor is influenced by the intended capacitor, but not an unintended capacitor, i.e., only negligibly, if any is present.

FIG. 1 is a schematic diagram of an apparatus 100 that includes an acquisition circuit 102, and optionally, a sampling circuit 104 and electrode 118, in accordance with one or more examples. In one or more examples, acquisition circuit 102, and apparatus 100 more generally, acquires a voltage-to-be-sampled $V_S$ ("voltage $V_S$") utilizing an energy pulse 126. Voltage $V_S$ exhibits a voltage level that is an indication of a self-capacitance $C_S$ of electrode 118. In contemplated operations, a self-capacitance $C_S$ of electrode 118 may change and voltage $V_S$ may change responsively.

Acquisition circuit 102 may include a switching circuit 106, a second energy source 108, a first energy source 110, a control circuit 112, an associated capacitor 114, and a connector 116. In one or more examples, acquisition circuit 102, and apparatus 100 more generally, may optionally include an electrode 118 depicting by FIG. 1 using dashed lines. In one or more examples, apparatus 100 may include an optional sampling circuit 104 to generate a value 120 that is indicative of a self-capacitance $C_S$ of electrode 118. In contemplated operations, a self-capacitance $C_S$ of electrode 118 may change, voltage $V_S$ may change, and value 120 generated by sampling circuit 104 may change proportionally thereto. Connector 116 may be, as non-limiting examples, a lead line, a pad, a pin, an input port, an output port, or an input/output port, without limitation.

Switching circuit 106 and control circuit 112 are coupled to generate a voltage $V_S$ across associated capacitor 114 that exhibits a voltage level indicative of a self-capacitance $C_S$ of an electrode 118 that is selectively coupled to connector 116 via switching circuit 106. Switching circuit 106 may, responsive to control circuit 112, selectively couple/de-couple first energy source 110 to connector 116 and electrode 118; selectively couple/de-couple first energy source 110 to associated capacitor 114; selectively couple/de-couple second energy source 108 (depicted by FIG. 1 as a ground source) to associated capacitor 114, connector 116, and electrode 118; selectively couple/de-couple associated capacitor 114 to connector 116; selectively couple/decouple associated capacitor 114 to sampling circuit 104—respectively at the same or different times.

In the specific non-limiting example depicted by FIG. 1, switching circuit 106 includes switches S1 to S6 to, as a non-limiting example, selectively turn ON or OFF various connections discussed herein responsive to control circuit 112. As used herein, when a switch (e.g., one or more of switches S1 to S6, without limitation), or a connection via a switch, is described as being "ON" that means current may transfer via the switch or connection, also referred to as being "closed," and when a switch is described as being "OFF" that means current does not transfer via the switch or connection, also referred to as being "open."

Control circuit 112 may be, or include, a processor or logic circuits to generate control signals 124 responsive to which switching circuit 106 and respective switches S1-S6 thereof may perform operations of an acquisition process to generate voltage $V_S$, and optionally to enable sampling circuit 104 to sample voltage $V_S$ and generate value 120.

In one or more examples, optional sampling circuit 104 may be coupled to generate a value 120 at least partially responsive to sampled voltage levels of voltage $V_S$ at associated capacitor 114. In one or more examples, sampling circuit 104 may be an ADC such as a successive approximation register (SAR) type ADC, without limitation. In one or more examples, associated capacitor 114 may be or include a capacitor that is external to sampling circuit 104, or may be or include a capacitor that is internal to sampling circuit 104, such as an internal capacitor of an ADC, without limitation.

As discussed above, in some contemplated operations, if electrode 118 and an external capacitive network (not depicted) coupled thereto are charged to a predetermined potential and an unintended capacitor is present at the capacitive network (e.g., a high impedance conductive material deposited on a capacitive sensor (the capacitive sensor being the intended capacitor), without limitation), such an unintended capacitor may influence a charge transfer, a voltage $V_S$, and the value 120.

In one or more examples, switching circuit 106 may be responsive to control circuit 112 to generate an energy pulse 126 via first energy source 110. A polarity of energy pulse 126 may be positive, or negative, in relation to the predetermined potential. A pulse-width of the energy pulse 126 may correspond substantially to a predetermined first time duration of the predetermined time durations 122 configured at control circuit 112. Energy pulse 126 may be a positive going pulse, or a negative going pulse. The operation is being described in an example where the predetermined potential is achieved from second energy source 108, and the energy pulse 126 provided from first energy source 110, however this is not meant to be limiting in any way. In another example (not shown), the predetermined potential is achieved from second energy source 108, and in yet another example, the energy pulse 126 is provided from second energy source 108.

In one or more examples, respective predetermined time durations 122 may be configured at control circuit 112 to respective values. Non-limiting examples of predetermined time durations 122 include a pulse-width of energy pulse 126 (also referred to herein as a "predetermined first time duration"), a time duration of a delay between providing energy pulse 126 and initiating a charge-share between electrode 118 and capacitive network coupled thereto and associated capacitor 114 (also referred to herein as a "predetermined second time duration"), and a time duration of a delay between initiating the charge-share between electrode 118 and associated capacitor 114 and sampling voltage $V_S$ generated at associated capacitor 114 (also referred to herein as a "predetermined third time duration"). In one or more examples, respective predetermined time durations 122 may be configured at control circuit 112, and maybe further configurable.

If a capacitive network coupled to electrode 118 includes a high impedance unintended capacitor and a low impedance intended capacitor, the high impedance unintended capacitor will resist energy transfer by an oscillating (or pulsed) signal to a much greater degree than the low impedance intended capacitor. Energy may be stored, at least momentarily, at the low impedance intended capacitor via an energy pulse if the pulse-width of the energy pulse is very short. The high impedance unintended capacitor will respond to the pulse as if the energy pulse were a high frequency signal and resists energy transfer to the unintended capacitor. The low impedance intended capacitor also responds to the pulse as if it were a high frequency signal, but its impedance (which in examples may be modeled as a wire) is insufficient to resist the energy transfer via the energy pulse.

In one or more examples, a value of a first predetermined time duration of the predetermined time durations 122 may be chosen to be resisted in the event a high impedance unintended capacitor is present and so substantially all of the energy of energy pulse 126 is stored, at least momentarily, at a low impedance intended capacitor coupled to electrode 118. As a non-limiting example, a pulse-width of less than 120 nanoseconds would be suitable for a capacitive touch sensor application or a capacitive material level sensor application, depending on the subject mechanical/physical implementation. In a specific non-limiting example a pulse width of between 0.5 and 120 nanoseconds would be suitable. The present disclosure is not limited to specific ranges for the pulse-width or timing, and utilization of a pulse-width different than the ranges discussed above does not exceed the scope of the disclosure.

In one or more examples, switching circuit 106 may be responsive to control circuit 112 to couple associated capacitor 114 and connector 116 to initiate a charge share between electrode 118 coupled to connector 116 and associated capacitor 114. In one or more examples, associated capacitor 114 and connector 116 may be coupled for a predetermined second time duration after the end of the first predetermined time duration of the energy pulse 126. A high impedance unintended capacitor will respond to the predetermined second time duration and resists energy transfer from the unintended capacitor, at least momentarily, and so a charge share between a capacitive network and associated capacitor 114 is primarily between associated capacitor 114 and an intended capacitor of the capacitive network.

In one or more examples, voltage $V_S$ generated at associated capacitor 114 responsive to such a charge share may be influenced primarily by the intended capacitor of the capacitive network, at least momentarily after the end of the predetermined second time duration. If optional sampling circuit 104 samples voltage $V_S$ at least substantially while a high impedance unintended capacitor would be resisting energy transfer therefrom, the voltage sample may be negligibly or not at all influenced by the unintended capacitor.

Notably, the present disclosure and various examples discussed herein are not limited to cases where high impedance materials are or may be deposited on one or more capacitive sensors. Various examples may be used to determine self-capacitance of an electrode in cases where a high-impedance material or another influencer that can cause capacitive coupling to form an unintended capacitor (e.g., noise or electromagnetic interference, without limitation) is present, or in cases where no such deposit or external influence is present.

Figure 2:
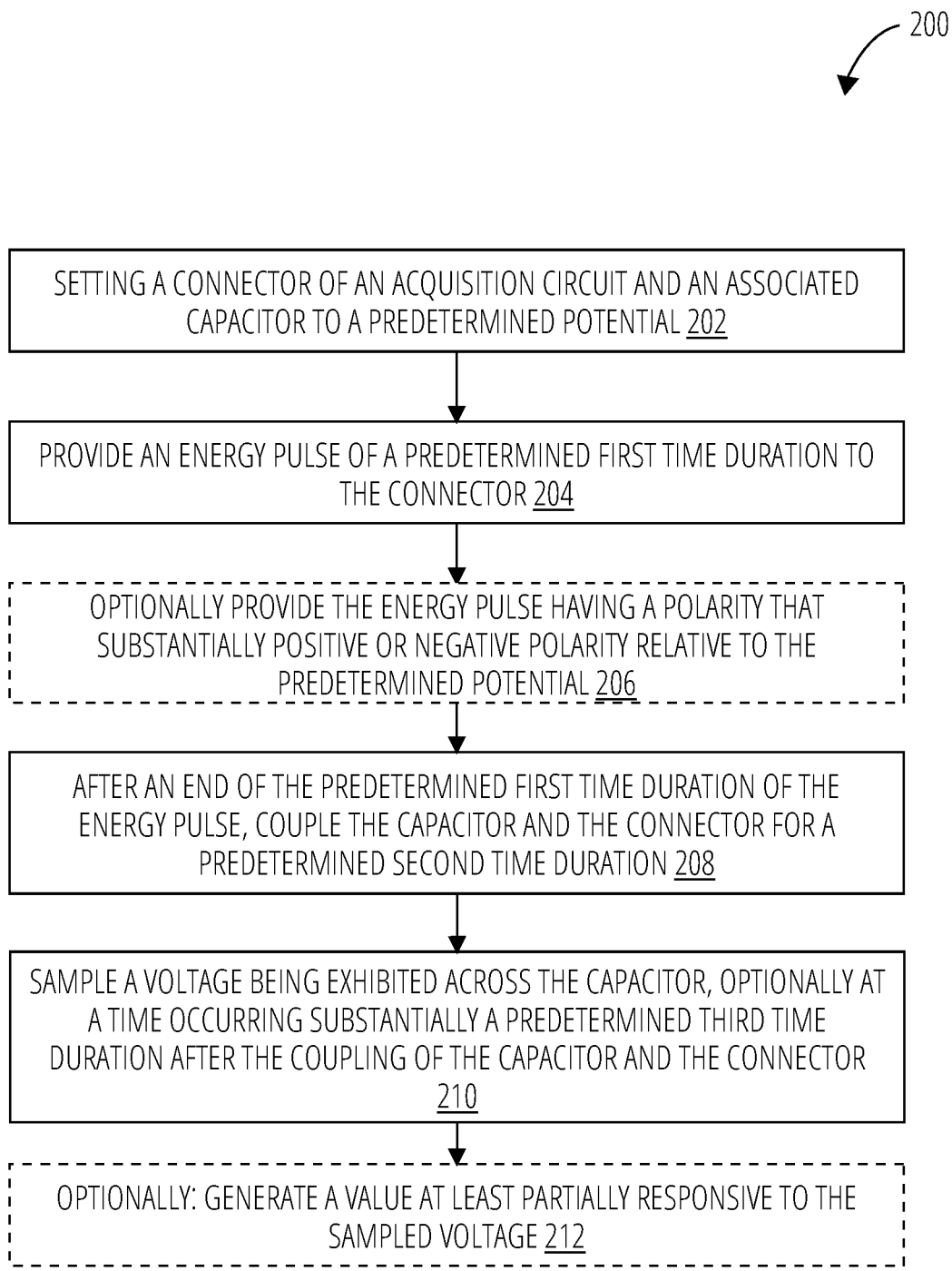
FIG. 2 is a flow diagram depicting a process in accordance with one or more examples.

FIG. 2 is a flow diagram depicting a process 200 to generate a voltage $V_S$ at an associated capacitor 114 indicative of a self-capacitance $C_S$ of electrode 118 coupled to connector 116, and optionally generate a value 120 indicative thereof, in accordance with one or more examples.

At operation 202, process 200 charges, or discharges, (e.g., by providing energy from first energy source 110 or second energy source 108, without limitation) a connector 116 of acquisition circuit 102 and an associated capacitor to a predetermined potential. In various examples, the energy may be a voltage or a current, without limitation. In various examples, the associated capacitor 114 or connector 116 may be set to a specific voltage level (e.g., a voltage level of a reference voltage, voltage level of a voltage rail, a fraction of a voltage level of a voltage rail or reference voltage, or ground, without limitation) via the provided energy. In one particular example, operation 202 discharges connector 116 of acquisition circuit 102 and the associated capacitor 114 to ground.

At operation 204, process 200 provides an energy pulse 126 (e.g., generated via first energy source 110 or second energy source 108, without limitation) of a predetermined first time duration (e.g., a time duration corresponding to one of predetermined time durations 122, without limitation) to the connector 116. In various embodiments, the energy pulse may be a current pulse or a voltage pulse. As discussed above, the predetermined first time duration may be chosen such that energy transfer is resisted by a high impedance unintended capacitor, if one is present, and permitted by a low impedance intended capacitor.

As indicated in optional operation 206, the energy pulse of operation 204 may be a positive going pulse in relation to the predetermined potential, or a negative going pulse in relation to the predetermined potential.

At operation 208, process 200 after an end of the predetermined first time duration of the energy pulse 126, couples the associated capacitor 114 and the connector 116 to initiate a charge sharing between the associated capacitor 114 and the connector 116, the charge sharing for a predetermined second time duration. In various examples, the predetermined second time duration maybe a time duration that corresponds to one of the predetermined time durations 122. Operation 208 may occur a small switching delay after the end of the first time duration, or promptly after the end of the first time duration, or after a third predetermined time duration after the end of the first time duration.

At operation 210, process 200 samples (e.g., via sampling circuit 104, without limitation) voltage $V_S$ being exhibited across associated capacitor 114. Optionally process 200 samples the voltage $V_S$ at a time occurring substantially a predetermined third time duration (e.g., a time duration corresponding to one of the predetermined time durations 122 configured at control circuit 112, without limitation) after the coupling of the associated capacitor 114 and connector 116. As a non-limiting example, in a capacitive touch sensor or capacitive material level sensor applications, the duration of the predetermined third time duration may be below about 200 nanoseconds, such associated capacitor 114 can be de-coupled from electrode 118 before an unintended capacitor, if any is present, can influence the intended capacitor and 114. In one non-limiting example, the third time duration is less than about 80 nanoseconds. Optionally, operation 210 may include de-coupling connector 116 from associated capacitor 114 prior to sampling the voltage exhibited across the capacitor.

At optional operation 212, process 200 generates value 120 at least partially responsive to a sampled voltage $V_S$. When operations 202, 204, 208 and 210 are performed at apparatus 100, value 120 is indicative of self-capacitance Cs of electrode 118 coupled to connector 116.

Figure 3:
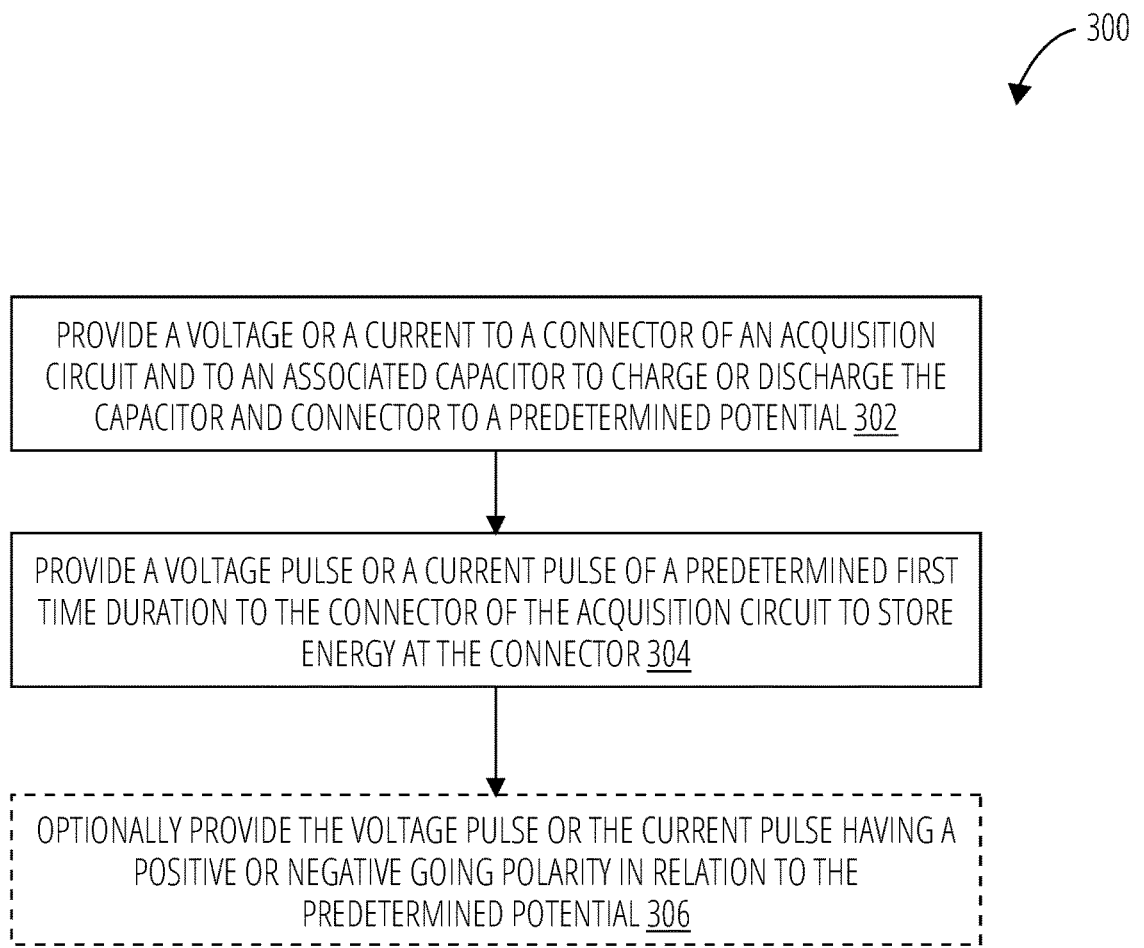
FIG. 3 is a flow diagram depicting a process, in accordance with one or more examples.

FIG. 3 is a flow diagram depicting a process 300 to charge, or discharge, the capacitor and connector to a predetermined potential and the energy pulse of operations 202 and 204 of process 200, respectively, in accordance with one or more examples.

At operation 302, process 300 provides a voltage source, or a voltage limited current source, to a connector of an acquisition circuit and to an associated capacitor to charge, or discharge, the capacitor and connector to a predetermined potential (i.e., voltage level).

At optional operation 304, process 300 provides a voltage pulse or a current pulse of a predetermined first time duration to the connector of the acquisition circuit to store energy at the connector, and optionally to an electrode coupled thereto, and optionally to an intended capacitor of a capacitive network coupled thereto.

At optional operation 306, process 300 provides the voltage pulse or the current pulse having a positive going polarity, or a negative going polarity, in relation to the predetermined potential provided in operation 302.

Figure 4:
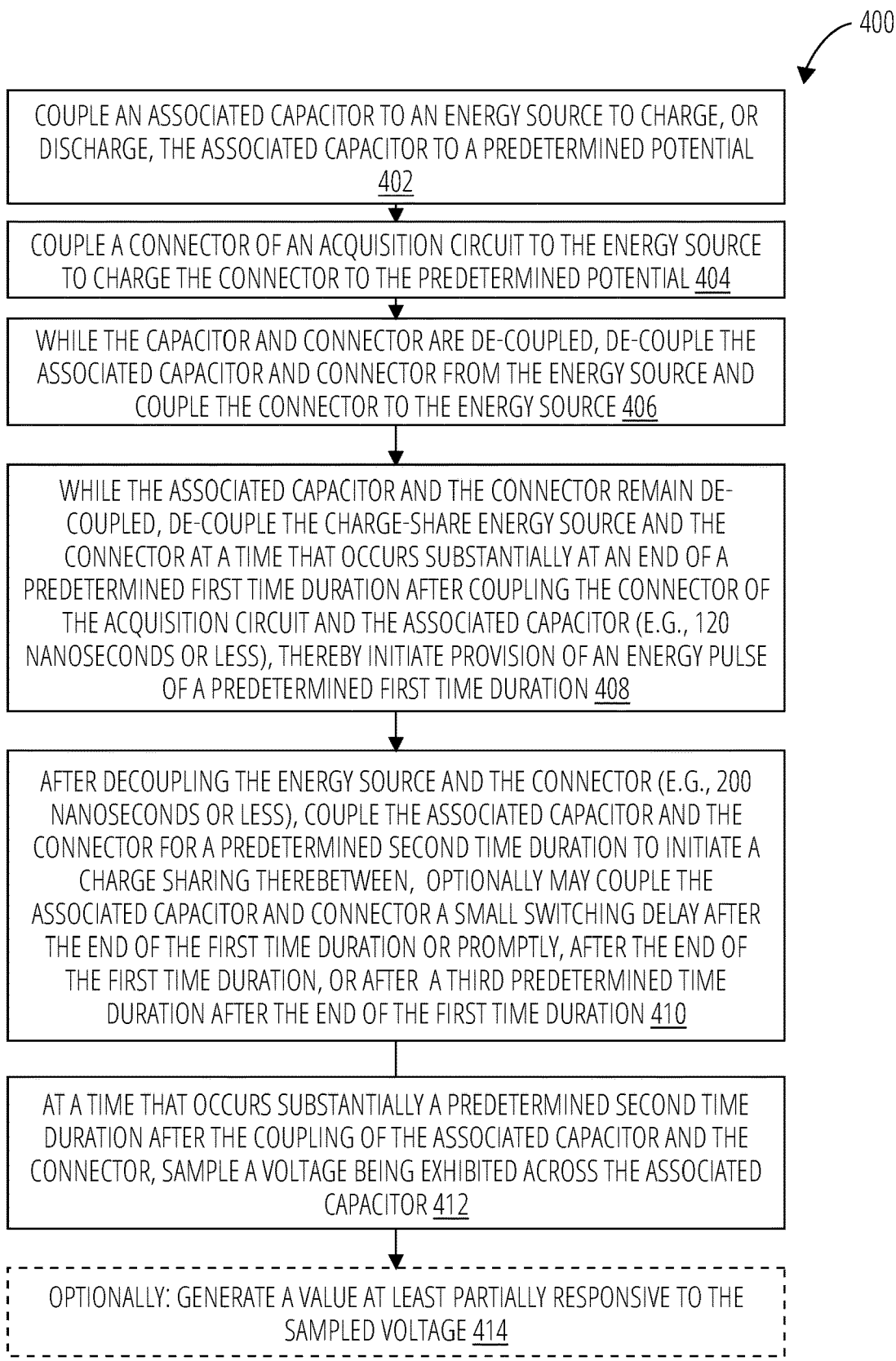
FIG. 4 is a flow diagram depicting a process, in accordance with one or more examples.

FIG. 4 is a flow diagram depicting a process 400 executed by apparatus 100 responsive to control circuit 112 to generate a voltage Vs and optionally a value 120, in accordance with one or more examples.

At operation 402, process 400 couples (e.g., via switch S3, which is turned ON, without limitation) associated capacitor 114 to an energy source, such as first energy source 110 or second energy source 108, without limitation, to charge, or discharge, the associated capacitor 114 to a predetermined potential, i.e., a specific voltage level.

At operation 404, process 400 couples (e.g., via switch S6, which is turned ON, without limitation) connector 116 of acquisition circuit 102 to the energy source, such as first energy source 110 or second energy source 108, without limitation, to charge, or discharge, the connector 116 to the predetermined potential.

During operation 402 and operation 404, switches S1 and S4 may be OFF, and those switches of S2, S3, S5 and S6 for unutilized connections to first energy source 110 or second energy source 108, may be OFF. S4 may be ON to ensure that connector 116 and associated capacitor 114 are at the predetermined potential.

At operation 406, with associated capacitor 114 and connector 116 initially de-coupled (e.g., switch S4 is OFF, without limitation), process 400 de-couples associated capacitor 114 and connector 116, respectively, from the coupled energy source. So, in the case of first energy source 110, switches S2 and S5 are turned OFF, and in the case of second energy source 108, switches S3 and S6 are turned OFF. Process 400 couples connector 116 to an energy source (e.g., first energy source 110 (e.g., via switch S5, which is turned ON, without limitation), or second energy source 108 (e.g., via switch S6, which is turned ON, without limitation)) to start providing an energy pulse.

At operation 408, with associated capacitor 114 and connector 116 de-coupled (e.g., switch S4 is OFF, without limitation), at a time occurring substantially at an end of a predetermined first time duration after coupling the connector 116 and energy source in operation 406, process 400 de-couples connector 116 and the energy source. In a case where first energy source 110 provides the energy for the energy pulse switch S5 is turned OFF, and in a case where second energy source 108 provides the energy for the energy pulse switch S6 is turned OFF.

The combination of operations 404 and 406 thereby provides an energy pulse of the predetermined first time duration.

At operation 410, process 400, after de-coupling connector 116 and the energy source, couples associated capacitor 114 and connector 116 (e.g., via switch S4, which is turned ON, without limitation) to initiate a charge sharing there between. Operation 410 may occur a small switching delay after the end of the first time duration, or promptly after the end of the first time duration, or after a third predetermined time duration after the end of the first time duration.

At operation 412, at a time occurring substantially at a predetermined second time duration after the coupling of associated capacitor 114 and connector 116, process 400 samples a voltage level exhibited by voltage $V_S$ at associated capacitor 114. In one or more examples, multiple samples may be taken by process 400 at operation 412.

At optional operation 414, process 400 generates a value 120 at least partially responsive to the sampled voltage level of voltage $V_S$. When operations 402, 404, 406, 408, 410, and 412 are performed at apparatus 100, value 120 is indicative of self-capacitance Cs of electrode 118 coupled to connector 116.

Figure 5:
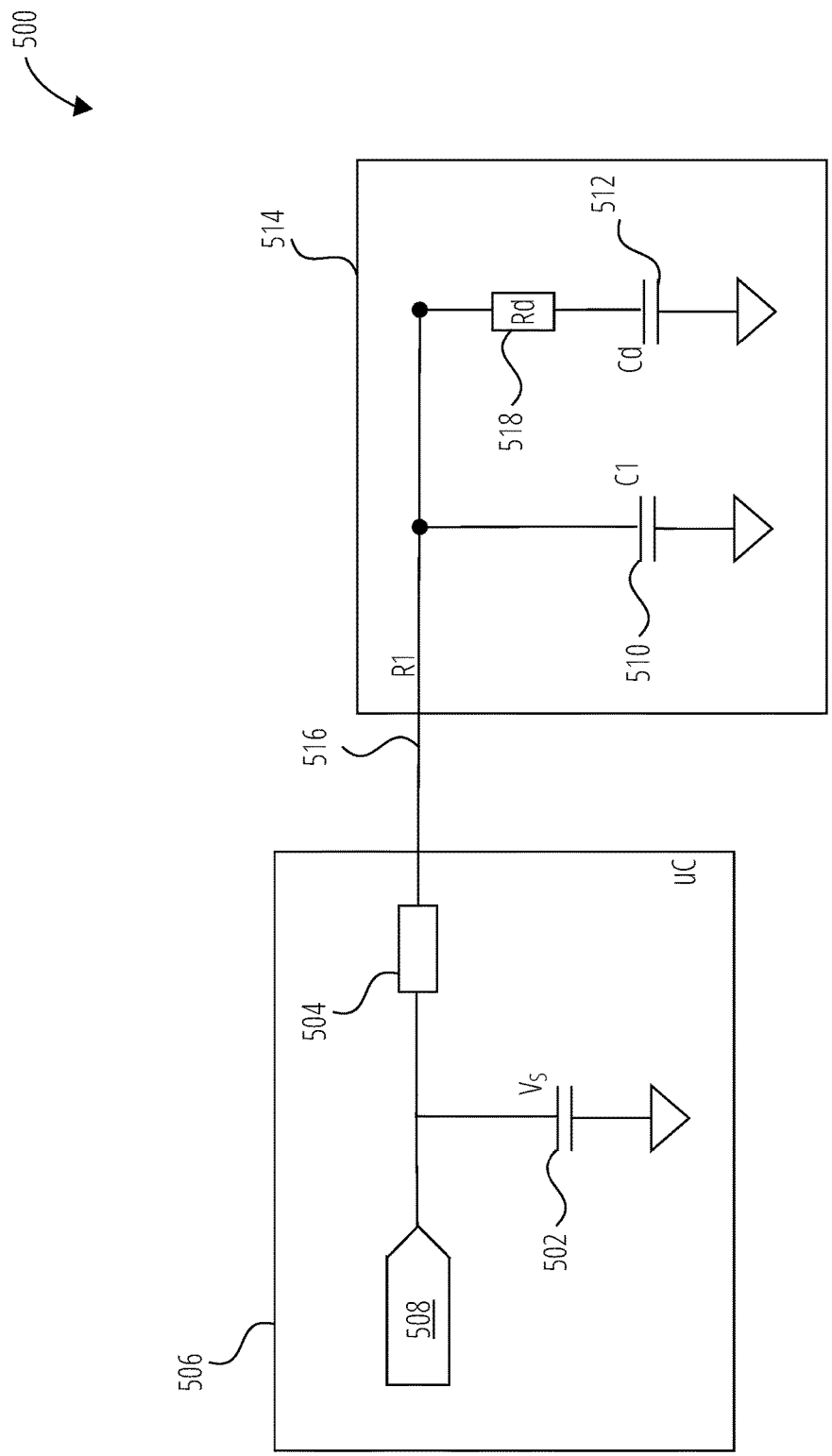
FIG. 5 is a schematic diagram of an example system that includes a measurement circuit coupled to a capacitive network via an external lead that includes an unintended capacitor.

FIG. 5 is a schematic diagram of a system 500 that includes a measurement circuit 506 coupled to a capacitive network 514 via external lead 516 that includes an unintended capacitor 512. Measurement circuit 506 is an apparatus 100 that includes acquisition circuit 102, sampling circuit 104 (here, ADC 508), and electrode 118 (here, external lead 516), though depicted by FIG. 5 as a simplified block diagram that includes ADC capacitor 502, switch 504 and ADC 508. In the specific non-limiting example depicted by FIG. 5, measurement circuit 506 is a circuit (e.g., an integrated circuit, without limitation) of a microcontroller labelled "uC."

A resistance R1 of intended capacitor 510 is depicted by FIG. 5 as a wire and a resistance Rd of unintended capacitor 512 is depicted as resistor 518 in series with unintended capacitor 512. A capacitance of intended capacitor 510 is depicted as capacitance C1 and a capacitance of unintended capacitor 512 is depicted as a capacitance Cd. Notably, during operation, respective resistances and impedances of intended capacitor 510 and unintended capacitor 512 may vary as a non-limiting example, based on a frequency response. In one or more examples, resistance R1 may represent respective resistances of a variety of resistive elements including without limitation resistors to protect ports of microcontroller uC from electrostatic discharge (ESD) or electromagnetic interference (EMI), resistance in a structure of ports of microcontroller uC such as transistors that form it, resistance in sensor lines and materials of a semiconductor structure of the sensor lines such as in an indium tin oxide (ITO) type structure, and resistance in connectors that ports of microcontroller uC connect to sensor lines such as feeding lines, tracking lines, and bond pads.

When an energy pulse is applied to capacitive network 514, the majority (i.e., substantially all) of energy of the energy pulse is stored in the intended capacitor 510 portion of capacitive network R1*C1, with a minority (i.e., at least some of the remainder, if there is any) of the energy of the energy pulse stored in the unintended capacitor 512. Charge transfer from the low impedance, intended capacitor 510, portion to the high impedance, unintended capacitor 512, portion is ongoing even when the energy pulse is ended, but the energy pulse increases the time it would take for the voltage on the low impedance portion to distribute with the high impedance portion because the slope of a voltage of the high impedance portion of capacitive network 514, voltage Vd, is responsive to a network including R1, C1, Rd and Cd, and so $\Delta V_{C1} > \Delta V_{Cd}$; where $\Delta V_{C1}$ corresponds to a slope (rate of change) of the voltage $V_{ci}$ across low impedance intended capacitor 510 of capacitive network 514, and $\Delta V_{Cd}$ corresponds to a slope (rate of change) of the voltage $V_{cd}$ across the high impedance unintended capacitor 512 of the capacitive network 514. Given that $\Delta V_{C1} > \Delta V_{Cd}$, the low impedance intended capacitor 510 responds to the aforementioned energy pulse (i.e., stores the energy therefrom, which is reflected in the voltage of the low impedance portion of capacitive network 514, voltage $V_1$) before unintended capacitor 512 responds (i.e., stores the energy therefrom, which is reflected in the voltage $V_d$ of the high impedance portion of capacitive network 514), and so low impedance intended capacitor 510 may be sampled as discussed herein while the voltage Vd across unintended capacitor 512 is small and does not meaningfully influence the acquisition of voltage $V_S$ at ADC capacitor 502.

Figure 6:
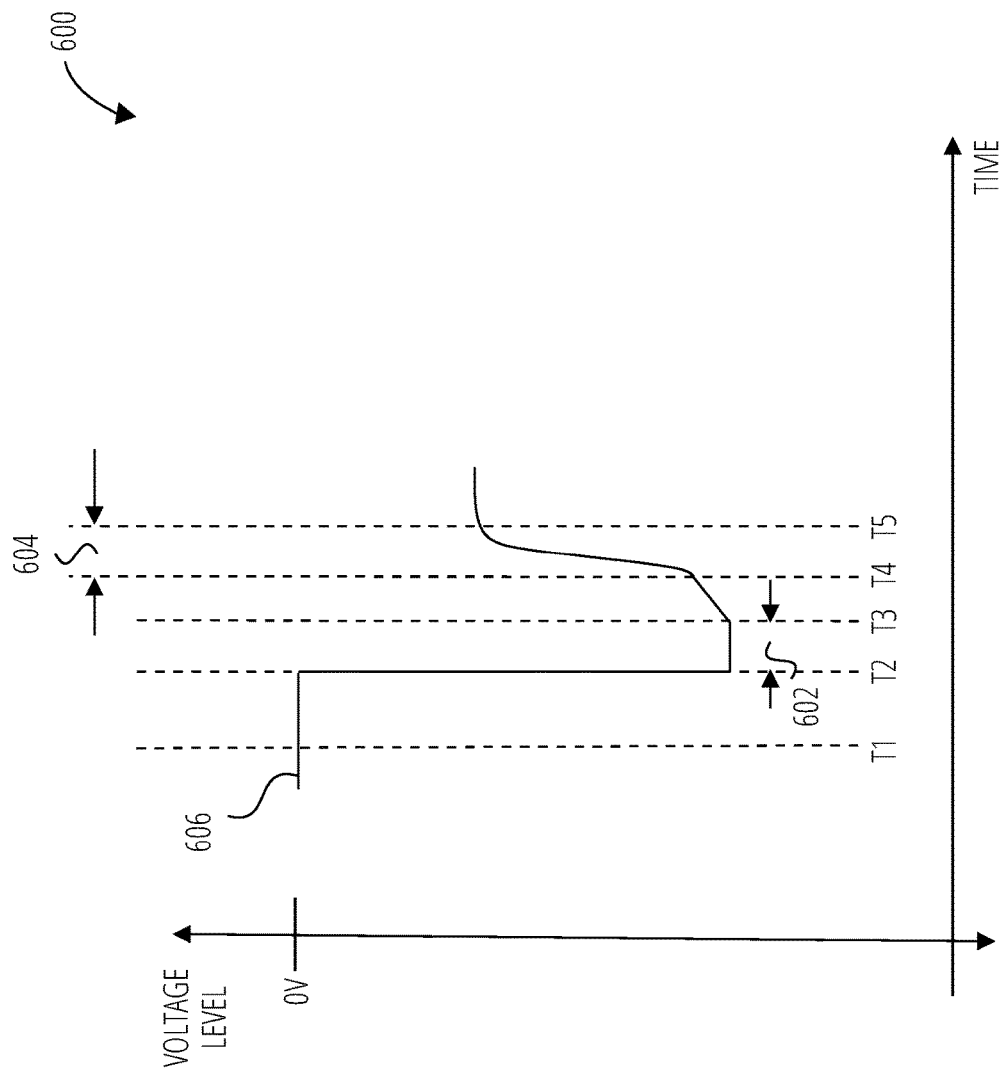
FIG. 6 is a timing diagram of a voltage at a lead coupled to a capacitive network of FIG. 5 during a contemplated operation in accordance with one or more example.

FIG. 6 is a signal diagram 600 of an example voltage waveform 606 for a voltage at lead 516 during a contemplated operation in accordance with one or more examples. The vertical axis is voltage level and the horizontal axis is time. At time T1, intended capacitor 510 has been set to the predetermined potential (in this specific example, discharged to 0 volts).

From times T2 to T3 an energy pulse of a negative polarity is applied to lead 516 that results in the portion of the simplified voltage waveform 606 depicted by FIG. 6 between times T2 and T3. The width of the voltage pulse has a time duration 602 that corresponds to a pulse-width of the voltage pulse applied between times T2 and T3. The impedance of unintended capacitor 512 resist energy transfer thereto via the voltage pulse defined between times T2 and T3.

In various non-limiting examples, a measurement process time duration of about 320 nanoseconds or less may be realized. In various non-limiting examples, a measurement process duration of about 120 nanoseconds or less may be realized. In various non-limiting examples, a time duration of about 40 nanoseconds or less may be realized. Such measurement process time duration is the time to acquire the voltage $V_S$ on the associated capacitor, and includes, as a non-limiting example, a predetermined first time duration 602 corresponding to a pulse-width of an energy pulse, switching delay, if any is present, and a predetermined second time duration 604 to charge share from intended capacitor 510 to associated capacitor 502.

When the voltage pulse finishes at time T3, from times T3 to T4 lead 516 exhibits a voltage level offset from the predetermined potential due to the applied charge pulse. From times T3 to T4 the lead 516 begins to reflect the voltage on the intended capacitor 510.

At time T4, switch 504 couples external lead 516 and capacitor 502, and, as discussed below, decouples external lead 516 and capacitor 502 at time T5. The time duration 604 between time T4 and time T5 acts as the predetermined second time duration, discussed above, and unintended capacitor 512 resist charge transfer therefrom. From time T4 to time T5, charge is transferred from intended capacitor 510 to capacitor 502. At least momentarily, the high impedance portion of capacitive network 514 that includes unintended capacitor 512 resists charge transfer to capacitor 502 from times T4 to T5. At time T5, switch 504 opens ending charge transfer from capacitive network 514 to capacitor 502. After time T5, the voltage level at lead 516 is influenced by unintended capacitor 512 but does not influence the voltage $V_s$ or a self-capacitance measurement more generally, so the voltage level of the voltage $V_s$ at intended capacitor 510 may be sampled.

Figure 7:
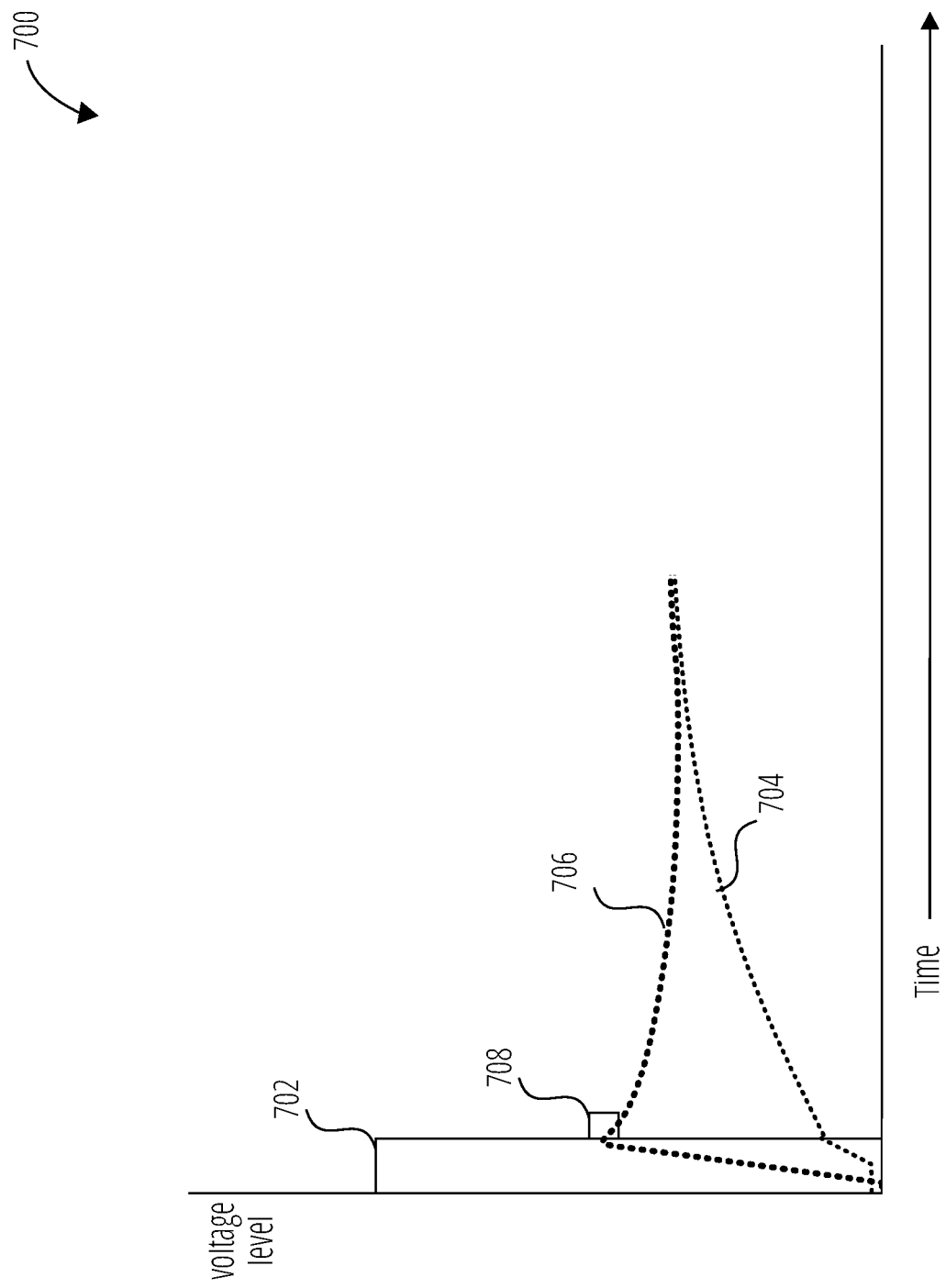
FIG. 7 is a graphical representation of respective voltage levels exhibited by voltages at an intended capacitor and at an unintended capacitor, during a contemplated operation in accordance with one or more examples.

FIG. 7 is a graphical representation 700 of voltage levels exhibited by respective voltages at intended capacitor 510 and unintended capacitor 512 of FIG. 5, during a contemplated operation in accordance with one or more examples. The vertical axis is voltage level and the horizontal axis is time. Line 706 represents a voltage level at the intended capacitor 510, and line 704 represents a voltage level at the unintended capacitor 512. Box 702 corresponds to a time when a voltage pulse, here of a positive polarity with respect to the predetermined potential, is applied to external lead 516 and capacitive network 514 more generally. The voltage level represented by line 706 rises rapidly and at the voltage level represented by the portion of line 706 within box 708 is distributed with ADC capacitor 502. At the time corresponding to the box 708 when the voltage represented by line 706 is sampled, a negligible voltage level is represented by line 704 compared to the voltage level represented by line 706 within box 708.

Any characterization in this description of something as "typical," "conventional," "known," or the like does not necessarily mean that it is disclosed in the prior art or that the discussed aspects are appreciated in the prior art. Nor does it necessarily mean that, in the relevant field, it is widely known, well-understood, or routinely used. It only means that it known to or appreciated by the inventors of this disclosure. As used in the present disclosure, the term "combination" with reference to a plurality of elements may include a combination of all the elements or any of various different sub combinations of some of the elements. For example, the phrase "A, B, C, D, or combinations thereof" may refer to any one of A, B, C, or D; the combination of each of A, B, C, and D; and any sub combination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims, without limitation) are generally intended as "open" terms (e.g., the term "including" should be interpreted as "including, but not limited to," the term "having" should be interpreted as "having at least," the term "includes" should be interpreted as "includes, but is not limited to," without limitation). As used herein, the term "each" means some or a totality. As used herein, the term "each and every" means a totality.

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more," without limitation); the same holds true for the use of definite articles used to introduce claim recitations. As used herein, the term "each" means some or a totality, and the term "each and every" means a totality.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations, without limitation). Furthermore, in those instances where a convention analogous to "at least one of A, B, and C, without limitation" or "one or more of A, B, and C, without limitation" is used, in general such a construction is intended to include A alone, B alone, C alone, A and B together, A and C together, B and C together, or A, B, and C together, without limitation.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Various examples of non-limiting examples of the disclosure include:

Example 1: An apparatus, comprising: a connector to couple to an electrode; a capacitor; a control circuit; a switching circuit responsive to the control circuit to: charge, or discharge, the connector and the capacitor to a predetermined potential; provide an energy pulse of a predetermined first time duration to the connector; and after an end of the predetermined first time duration of the energy pulse, couple the capacitor and the connector for a predetermined second time duration; and a sampling circuit to sample a voltage exhibited across the capacitor.

Example 2: The apparatus according to Example 1, wherein the switching circuit responsive to the control circuit to: couple the connector and an energy source; and at the time that occurs substantially at the end of the predetermined first time duration, de-couple the connector and the energy source, and thereby provide the energy pulse of the predetermined first time duration to the connector.

Example 3: The apparatus according to Examples 1 or 2, wherein the switching circuit responsive to the control circuit to couple the connector and the energy source after the charging or discharging of the connector to the predetermined potential.

Example 4: The apparatus according to any of Examples 1 through 3, wherein the energy pulse is of a positive polarity in relation to the predetermined potential.

Example 5: The apparatus according to any of Examples 1 through 4, wherein the energy pulse is of a negative polarity in relation to the predetermined potential.

Example 6: The apparatus according to any of Examples 1 through 5, wherein the sampling circuit to generate a value is at least partially responsive to the sampled voltage.

Example 7: The apparatus according to any of Examples 1 through 6, wherein the sampling circuit comprises an analog-to-digital converter.

Example 8: The apparatus according to any of Examples 1 through 7, wherein the predetermined first time duration is configured at the control circuit.

Example 9: The apparatus according to any of Examples 1 through 8, wherein the predetermined second time duration is configured at the control circuit.

Example 10: The apparatus according to any of Examples 1 through 9, wherein the predetermined first time duration is set to a time duration of about 120 nanoseconds or less.

Example 11: The apparatus according to any of Examples 1 through 10, wherein the predetermined second time duration is set to a time duration of about 200 nanoseconds or less.

Example 12: The apparatus according to any of Examples 1 through 11, wherein the sampling circuit is an analog-to-digital-converter.

Example 13: The apparatus according to any of Examples 1 through 12, wherein the switching circuit comprises: a switch to selectively couple the capacitor to a first energy source to charge, or discharge, the capacitor to the predetermined potential; a switch to selectively couple the connector to the first energy source to charge, or discharge, the connector to the predetermined potential; and a switch to selectively couple the connector to a second energy source to provide the energy of the energy pulse.

Example 14: The apparatus according to any of Examples 1 through 13, wherein the first energy source is a voltage source.

Example 15: The apparatus according to any of Examples 1 through 14, wherein the first energy source is a current source.

Example 16: A method, comprising: setting a connector of an acquisition circuit and an associated capacitor to a predetermined potential; providing an energy pulse of a predetermined first time duration to the connector; after an end of the predetermined first time duration of the energy pulse, coupling the associated capacitor and the connector of the acquisition circuit for a predetermined second time duration; and sampling a voltage being exhibited across the associated capacitor.

Example 17: The method according to Example 16, wherein the setting the associated capacitor and the connector of the acquisition circuit to the predetermined potential comprises: providing a voltage to the associated capacitor and the connector of the acquisition circuit.

Example 18: The method according to Examples 16 or 17, wherein the setting the associated capacitor and the connector of the predetermined potential comprises: providing a current to the associated capacitor and the connector of the acquisition circuit.

Example 19: The method according to any of Examples 16 through 18, wherein the providing the energy pulse of the predetermined first time duration to the connector of the acquisition circuit comprises: providing a voltage pulse of the predetermined first time duration to the connector of the acquisition circuit.

Example 20: The method according to any of Examples 16 through 19, wherein the providing the energy pulse of the predetermined first time duration to the connector of the acquisition circuit comprises: providing a current pulse of the predetermined first time duration to the connector of the acquisition circuit.

Example 21: The method according to any of Examples 16 through 20, wherein the energy pulse of the predetermined first time duration to the connector of the acquisition circuit is of a positive polarity in relation to the predetermined potential.

Example 22: The method according to any of Examples 16 through 21, wherein the energy pulse of the predetermined first time duration is of a negative polarity in relation to the predetermined potential.

Example 23: The method according to any of Examples 16 through 22, wherein the predetermined first time duration is set to a time duration of about 120 nanoseconds or less.

Example 24: The method according to any of Examples 16 through 23, wherein the predetermined second time duration is set to a time duration about 200 nanoseconds or less.

What is claimed is:

1. An apparatus, comprising:
   a connector to couple to an electrode;
   a capacitor;
   a control circuit;
   a switching circuit responsive to the control circuit to:
      charge, or discharge, both of the connector and the capacitor to a predetermined potential by coupling the connector and the capacitor to a first energy source;
      de-couple the connector and the capacitor from the first energy source;
      provide an energy pulse of a predetermined first time duration to the connector by coupling the connector to a second energy source, the energy pulse having an opposite polarity in relation to the predetermined potential; and
      after an end of the predetermined first time duration of the energy pulse, couple the capacitor and the connector for a predetermined second time duration; and
   a sampling circuit to sample a voltage exhibited across the capacitor after an end of the predetermined second time duration.

2. The apparatus of claim 1, wherein the switching circuit responsive to the control circuit to: at the time that occurs substantially at the end of the predetermined first time duration, de-couple the connector and the second energy source, to thereby end the energy pulse of the predetermined first time duration.

3. The apparatus of claim 2, wherein the switching circuit responsive to the control circuit to couple the connector to the second energy source after the charging or discharging of both of the connector and the capacitor to the predetermined potential.

4. The apparatus of claim 1, wherein the energy pulse is of a positive polarity in relation to the predetermined potential.

5. The apparatus of claim 1, wherein the energy pulse is of a negative polarity in relation to the predetermined potential.

6. The apparatus of claim 1, wherein the sampling circuit to generate a value is at least partially responsive to the sampled voltage.

7. The apparatus of claim 1, wherein the sampling circuit comprises an analog-to-digital converter.

8. The apparatus of claim 1, wherein the predetermined first time duration is configured at the control circuit.

9. The apparatus of claim 1, wherein the control circuit comprises a processor, and respective pulse-widths associated with the predetermined first and the second time durations are configured at the control circuit comprising the processor.

10. The apparatus of claim 1, wherein the predetermined first time duration is set to a time duration of about 120 nanoseconds or less.

11. The apparatus of claim 1, wherein the predetermined second time duration is set to a time duration of about 200 nanoseconds or less.

12. The apparatus of claim 1, wherein the sampling circuit is an analog-to-digital-converter.

13. The apparatus of claim 1, wherein the switching circuit comprises:
    a switch to selectively couple the capacitor to the first energy source to charge, or discharge, the capacitor to the predetermined potential;
    a switch to selectively couple the connector to the first energy source to charge, or discharge, the connector to the predetermined potential; and
    a switch to selectively couple the connector to the second energy source to provide the energy of the energy pulse.

14. The apparatus of claim 13, wherein the connector is coupled to the electrode of a capacitive touch sensor.

15. The apparatus of claim 13, wherein the connector is coupled to the electrode of a capacitive touch sensor of a sensor array of a touch sensor application.

16. A method, comprising:
    setting a connector of an acquisition circuit and an associated capacitor to a predetermined potential by coupling both of the connector and the associated capacitor to a first energy source;
    de-coupling the connector and the associated capacitor from the first energy source;
    providing an energy pulse of a predetermined first time duration to the connector by coupling the connector to a second energy source at a beginning of the predetermined first time duration, and de-coupling the connector from the second energy source at an end of the predetermined first time duration, the energy pulse having an opposite polarity in relation to the predetermined potential;

after an end of the predetermined first time duration of the energy pulse, coupling the associated capacitor and the connector of the acquisition circuit for a predetermined second time duration; and sampling a voltage being exhibited across the associated capacitor after an end of the predetermined second time duration.

17. The method of claim 16, wherein the setting the associated capacitor and the connector of the acquisition circuit to the predetermined potential comprises: providing a voltage to the associated capacitor and the connector of the acquisition circuit.

18. The method of claim 16, wherein the setting the associated capacitor and the connector of the predetermined potential comprises:

providing a current to the associated capacitor and the connector of the acquisition circuit.

19. The method of claim 16, wherein the providing the energy pulse of the predetermined first time duration to the connector of the acquisition circuit comprises:

providing a voltage pulse of the predetermined first time duration to the connector of the acquisition circuit.

20. The method of claim 16, wherein the providing the energy pulse of the predetermined first time duration to the connector of the acquisition circuit comprises:

providing a current pulse of the predetermined first time duration to the connector of the acquisition circuit.

21. The method of claim 16, wherein the energy pulse of the predetermined first time duration to the connector of the acquisition circuit is of a positive polarity in relation to the predetermined potential.

22. The method of claim 16, wherein the energy pulse of the predetermined first time duration is of a negative polarity in relation to the predetermined potential.

23. The method of claim 17, wherein the predetermined first time duration is set to a time duration of about 120 nanoseconds or less.

24. The method of claim 17, wherein the predetermined second time duration is set to a time duration about 200 nanoseconds or less.

* * * * *

UNITED STATES PATENT AND TRADEMARK OFFICE
CERTIFICATE OF CORRECTION

PATENT NO. : 11,781,886 B2
APPLICATION NO. : 17/446768
DATED : October 10, 2023
INVENTOR(S) : Mirko Loncaric It is certified that error appears in the above-identified patent and that said Letters Patent is hereby corrected as shown below:

In the Specification
Column 11, Line 45, change "voltage $V_{ci}$ across" to --voltage $V_{C1}$ across--

Signed and Sealed this
Twenty-seventh Day of February, 2024

Katherine Kelly Vidal
*Director of the United States Patent and Trademark Office*